United States Patent [19]
Lou

[11] Patent Number: 5,618,747
[45] Date of Patent: Apr. 8, 1997

[54] PROCESS FOR PRODUCING A STACKED CAPACITOR HAVING POLYSILICON WITH OPTIMUM HEMISPHERICAL GRAINS

[75] Inventor: Chine-Gie Lou, Hsinchu, Taiwan

[73] Assignee: Industrial Technology Research Institute, Hsinchu, Taiwan

[21] Appl. No.: 657,073

[22] Filed: Jun. 3, 1996

[51] Int. Cl.⁶ .............................. H01L 21/70; H01L 27/00
[52] U.S. Cl. ......................... 438/398; 438/255; 438/684
[58] Field of Search .................................. 437/52, 60, 919

[56] References Cited

U.S. PATENT DOCUMENTS

| | | | |
|---|---|---|---|
| 5,225,378 | 7/1993 | Ushikawa | 437/233 |
| 5,278,091 | 1/1994 | Fazan et al. | 437/52 |
| 5,290,729 | 3/1994 | Hayashide et al. | 437/60 |
| 5,358,883 | 10/1994 | Ahn et al. | 437/52 |
| 5,366,919 | 11/1994 | Tanaka et al. | 437/52 |
| 5,369,048 | 11/1994 | Hsue | 437/52 |

*Primary Examiner*—Jey Tsai
*Attorney, Agent, or Firm*—George O. Saile

[57] ABSTRACT

A process, and apparatus, for depositing hemispherical grained polysilicon layers, used for the fabrication of stacked capacitor structures, for DRAM devices, has been developed. The hemispherical grained polysilicon layer is deposited in an LPCVD tool, equipped with multiple heating zones, to allow the narrow temperature range needed for maximum surface roughness of the hemispherical grained polysilicon layers, to be obtained. In addition the LPCVD tool features multiple reactant injection inlets, reducing reactant concentration depletion across the length of the reaction zone, thus improving the uniformity of the hemispherical grained layers, from wafer to wafer.

12 Claims, 4 Drawing Sheets

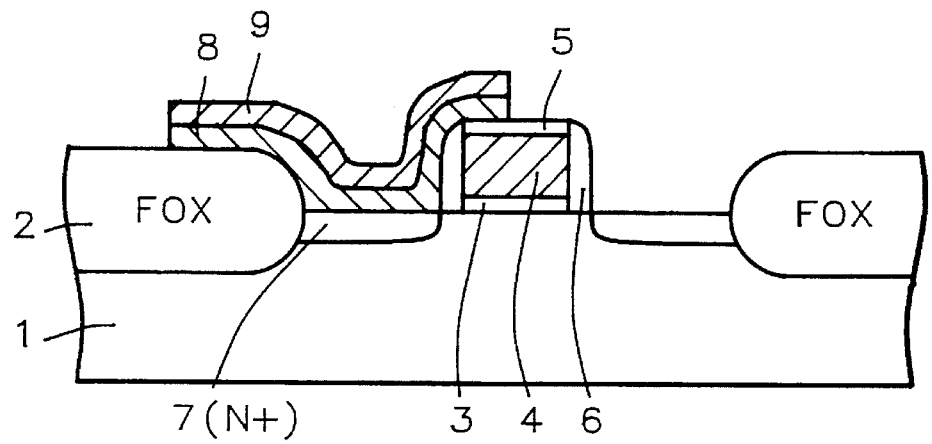
*FIG. 1*
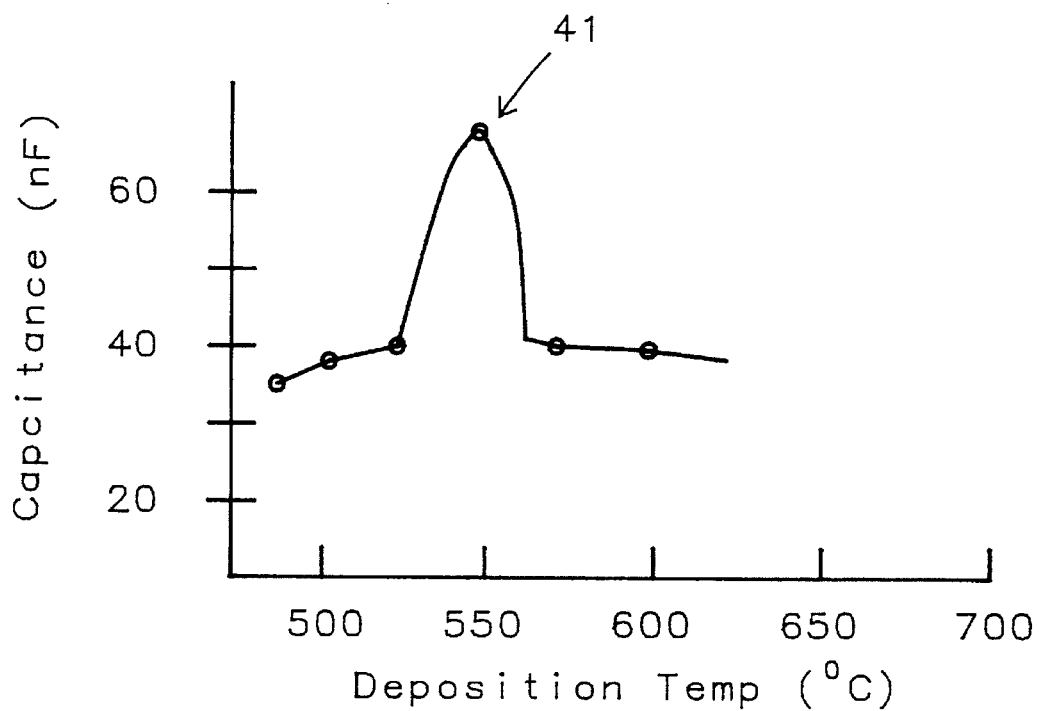
*FIG. 2 - Prior Art*

PROCESS FOR PRODUCING A STACKED CAPACITOR HAVING POLYSILICON WITH OPTIMUM HEMISPHERICAL GRAINS

BACKGROUND OF THE INVENTION (1) Field of the Invention

The present invention relates to the fabrication of dynamic random access memory, (DRAM), devices, and more specifically to the process and apparatus used to produce DRAM structures with increased capacitance.

(2) Description of Prior Art

A critical parameter of a DRAM device is the ability of the storage node, of the DRAM device, to supply the desired capacitance needed for circuit performance. The basic DRAM memory cell is usually comprised of a transfer gate transistor and a connected capacitor. Charges are stored in the capacitor section of the DRAM, and are accessed via the transfer gate transistor. The ability to densely pack storage cells, while maintaining sufficient stored charge, is a function of the type and structure of the capacitor of the DRAM device. One method used by DRAM manufacturers, for capacitors, is the stacked capacitor cell, (STC), structure. This structure consists of two conductive layers, for example polysilicon, with a thin dielectric, or thin composite dielectric layer, between the polysilicon layers, with the capacitor structure overlying, and contacting, specific regions of an underlying transfer gate transistor.

However as DRAM densities increase, resulting in smaller device dimensions, the ability to maintain adequate capacitance using the STC structure becomes difficult. The decreasing dimensions of the transfer gate transistor limits the dimensions of the overlying capacitor plates, thus severely limiting the ability to maintain the capacitance needed to operate the DRAM device. Alternatives for maintaining device signal, or capacitance, include decreasing the thickness of the dielectric layer, between the conductive polysilicon layers. However it is difficult to decrease the thickness of the dielectric layer much below 100 Angstroms, in silicon dioxide equivalent, without risking yield or reliability concerns. Therefore the industry has attempted to address the capacitance issue by increasing the area of the conductive plates, while still maintaining, or even decreasing the dimensions of the underlying transfer gate transistor. This has been accomplished by producing a polysilicon layer, used as a lower conductive plate, with the polysilicon exhibiting a roughened, or a hemispherical grained, (HSG), surface. The HSG polysilicon surface, with concave and convex features, results in a significant increase in surface area, when compared to counterparts with flat polysilicon surfaces, and thus resulting in increased capacitance of the STC structure, without increasing the dimensions of the DRAM cell.

The ability to create HSG polysilicon layers, with the maximum level of roughness is dependent on deposition parameters and apparatus. A pending application, 08/450,299, describes a narrow temperature range for obtaining the maximum polysilicon HSG roughness. Other descriptions for producing HSG polysilicon layers have also been supplied, previously by Hayashide, et al, in U.S. Pat. No. 5,290,729, as well as Fazen, et al, in U.S. Pat. No. 5,278,091. However these descriptions do not teach the processes needed to obtain the uniformity of polysilicon HSG roughness, from wafer to wafer, in a specific deposition tool.

This invention will describe a process and a deposition tool, in which the desired narrow temperature range, and the desired consistent reactant concentration, needed to maximize the HSG roughness across the length of the deposition tool, is achieved.

SUMMARY OF THE INVENTION

It is an object of this invention to provide a method for fabricating DRAM devices using a stacked capacitor structure.

It is another object of this invention to use a stacked capacitor structure in which the lower electrode is a polysilicon layer.

It is yet another object of this invention to use a roughened surface, polysilicon layer, for the lower electrode, for purposes of increasing the surface area of the lower electrode, and thus increasing the capacitance of the DRAM device.

It is still yet another object of this invention to deposit the roughened surface polysilicon layer, in a low pressure chemical vapor deposition, (LPCVD), tool, in which multiple zone heating, and multiple reactant injection inlets, are used to improve the uniformity of wafer temperature, as well as reactant gas concentration uniformity.

In accordance with the present invention a method is described for fabricating a stacked capacitor structure, DRAM device, in which the lower electrode, or storage node, is fabricated using a roughened surface, polysilicon layer, deposited in an LPCVD tool featuring multiple heating zones, as well as multiple reactant injection inlets. The method consists of initially providing a transfer gate transistor, fabricated using thick field oxide regions, used to define the active device region, followed by the formation of a polysilicon gate structure, on a thin gate oxide. An insulator sidewall is created on the polysilicon gate structure, followed by an ion implantation procedure, used to create the source and drain regions of the transfer gate transistor. A three stage polysilicon deposition procedure is next performed starting with an underlying, intrinsic layer, and followed by an insitu doped polysilicon layer. After patterning of the two polysilicon layers, via conventional photolithographic and dry etching procedures, the critical HSG polysilicon layer is deposited in the LPCVD tool, which features multiple heating zones and multiple reactant injection inlets. Photolithographic and dry etch procedures are then employed to pattern the HSG polysilicon layer, completing the formation of the lower electrode, or storage node. Next a thin dielectric layer, oxidized silicon nitride on silicon oxide, (ONO), is formed on the patterned, roughened, HSG polysilicon layer, followed by the deposition of another polysilicon layer. Photolithographic and dry etch procedures are then employed to pattern the polysilicon layer, creating the upper electrode, or cell plate of the stacked capacitor structure.

BRIEF DESCRIPTION OF THE DRAWINGS

The object and other advantages of this invention are best described in the preferred embodiment with reference to the attached drawings that include:

FIG. 1, which schematically in cross-sectional style, shows the transfer gate transistor, and the early stages of fabrication of the lower electrode.

FIG. 2, shows prior art, and the relationship between the degree of roughness of the HSG polysilicon, in terms of capacitance, as a function of the deposition temperature of the HSG poiysilicon layer.

DESCRIPTION OF THE PREFERRED EMBODIMENTS

Figure 3:
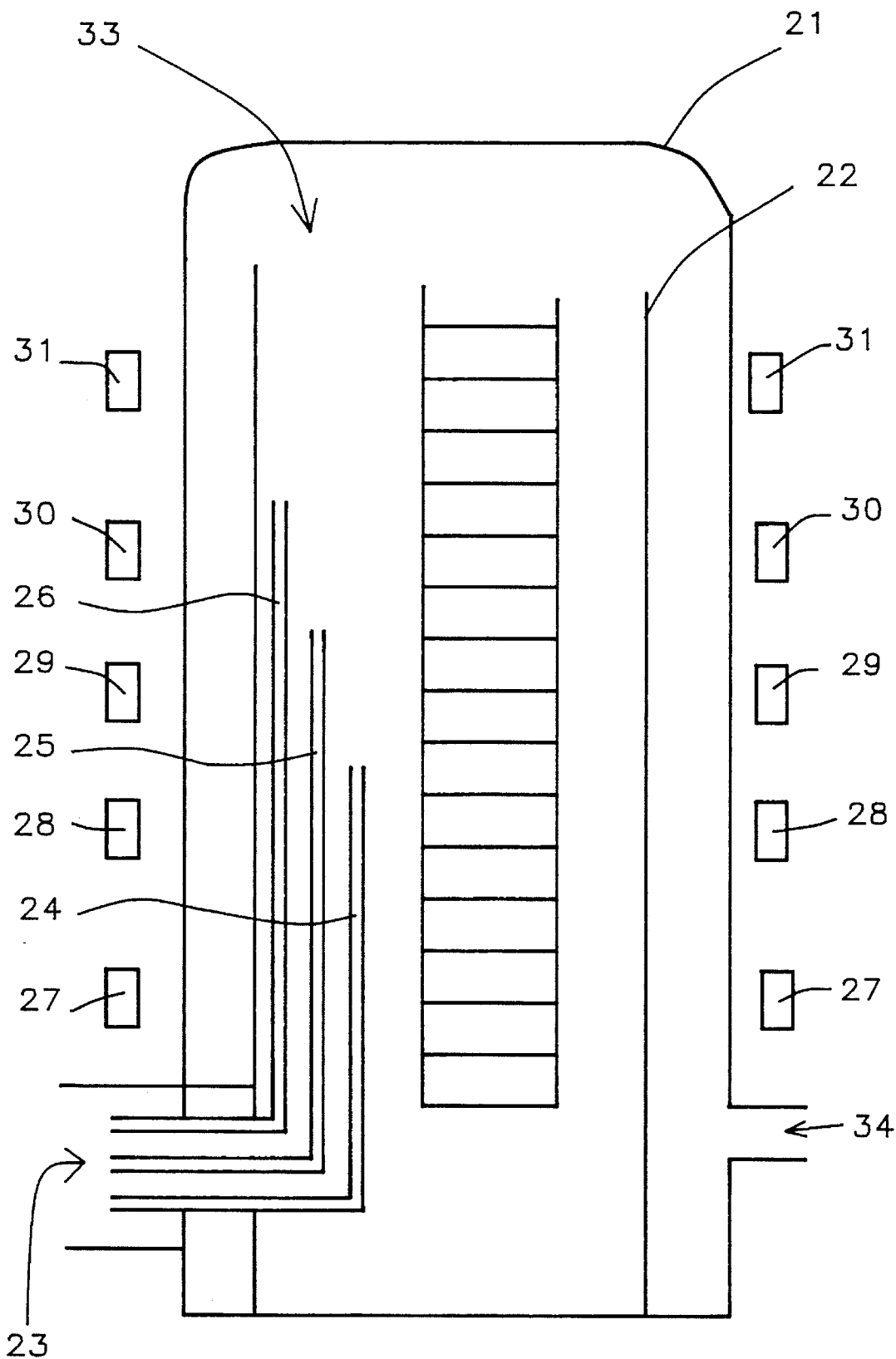
FIG. 3, schematically shows the LPCVD tool, used in this invention, for the HSG polysilicon deposition, featuring multiple heating zones, and multiple reactant injection inlets.

The process for fabricating a stacked capacitor, DRAM cell, using a HSG polysilicon Layer as part of the storage node, with the HSG polysilicon layer being deposited in an LPCVD tool featuring multiple heating zones, and multiple reactant injection inlets, for purposes of optimizing the roughness of the HSG layer, as well as improving the thickness uniformity from wafer to wafer, will now be described in detail. Conventional stacked capacitor DRAM structures are currently being manufactured in industry, therefore only the specific areas unique to understanding this invention will be described in detail.

FIG. 1, schematically shows the transfer gate transistor, including the early fabrication stages of the lower electrode, or storage node, of the stacked capacitor structure. A P type substrate, 1, composed of single crystalline silicon, with a <100> crystallographic orientation, is used. A field oxide region, (FOX), 2, is formed in substrate, 1. This is accomplished by creating an oxidation mask of a thin silicon dioxide, obtained via thermal oxidation, followed by the LPCVD silicon nitride layer. After photolithographic and reactive ion etching, (RIE), procedures, used to create the desired image in the composite, silicon nitride—silicon dioxide oxidation mask, the photoresist is removed, and the FOX regions are formed, in the non-masked areas, via thermal oxidation, in an oxygen—steam ambient, to a thickness between about 4000 to 6000 Angstroms. The composite oxidation mask is next removed, exposing the region to be used for subsequent device fabrication, using hot phosphoric acid for the silicon nitride layer, and a buffered hydrofluoric acid for the underlying silicon dioxide layer. A thin silicon dioxide layer, 3, is next thermally grown at a temperature between about 850° to 950° C., to a thickness between about 80 to 170 Angstroms, in areas not covered by FOX region, 2, for use as a gate insulator. Next an insitu doped polysilicon layer, 4, is deposited, using LPCVD procedures, at a temperature between about 550° to 650° C., to a thickness between about 2000 to 4000 Angstroms, using $SiH_4$ and $PH_3$. The polysilicon can also be deposited intrinsically and doped via an ion implantation of phosphorous, at an energy between about 30 to 70 Kev, at a dose between about 5E14 to 1E16 atoms/cm$^2$.

A layer of silicon oxide, 5, is next deposited, using LPCVD procedures, at a temperature between about 650° to 750° C., to a thickness between about 1000 to 3000 Angstroms. Conventional photolithographic and RIE procedures, using $CHF_3$ as the etchant for silicon oxide layer, 5, and $Cl_2$ and HBr as etchants for polysilicon layer, 4, are used to create a polysilicon gate structure, shown in FIG. 1. After photoresist removal, using plasma oxygen ashing and careful wet cleans, another silicon oxide layer, 6, is deposited, again using LPCVD procedures, at a temperature between about 650° to 750° C., to a thickness between about 1000 to 4000 Angstroms. An anisotropic RIE procedure, using $CHF_3$ as an etchant, is then performed to create silicon oxide, sidewall spacers. Self-aligned source and drain regions, 7, are then created via an ion implantation of arsenic, at an energy between about 50 to 100 KeV, at a dose between about 1E14 to 5E15 atoms/cm$^2$.

The processing needed to form the lower electrode, or storage node, for the stacked capacitor structure, is next addressed. First a lower layer of intrinsic polysilicon, 8, is deposited using LPCVD procedures, at a temperature between about 550° to 630° C., to a thickness between about 1000 to 3000 Angstroms, using $SiH_4$, followed by an insitu doped polysilicon layer, 9, obtained via LPCVD procedures at a temperature between about 550° to 600° C., to a thickness between about 500 to 2500 Angstroms, using $PH_3$ and $SiH_4$. Polysilicon layer, 9, can also be deposited intrinsically, using only $SiH_4$, and doped via ion implantation of phosphorous, at an energy between about 30 to 60 KeV, at a dose between about 5E14 to 5E15 atoms/cm$^2$. Conventional photolithographic and RIE procedures, using $Cl_2$ and HBr as etchants, are used to define the bottom portion of the lower electrode, formed from the two polysilicon layers, shown schematically in FIG. 1. Photoresist removal is again performed using plasma oxygen ashing and careful wet cleans.

The critical aspect of stacked capacitor structures, and of this invention is next addressed. To increase the signal of the DRAM device, capacitance has to be maximized. This can be accomplished by either using a higher dielectric constant material for the capacitor dielectric, decreasing the thickness of the capacitor dielectric, or increasing the area of the capacitor. For yield and reliability reasons, the option of either thinning the capacitor dielectric layer, or using a layer with a higher dielectric constant, presents unwanted risks. Therefore the industry has addressed the need for increased capacitance by creating a stacked capacitor structure, featuring a polysilicon layer exhibiting roughened surfaces, that is a surface comprised of convex and concave features. This type of polysilicon layer, referred to as hemispherical grains, (HSG), allows an increase in surface area, when compared to counterparts fabricated with flat surfaces. However the magnitude of the roughness of the HSG poiysilicon layer, or the expected increase in capacitance due to the increased roughness, is a function of the deposition conditions of the HSG layer, specifically the deposition temperature. FIG. 2, show prior art, obtained from a paper by Watanabe, et al, in Extended Abstracts of the 22nd (1990 International) Conference on Solid State Devices and Materials, Sendai, 1990, pp. 873–876. in which capacitance, or the degree of roughness of a HSG polysilicon layer, is shown to be a strong function of the deposition temperature. It can be seen that only a narrow temperature range, 41, exists, between about 545° to 555° C., in which the maximum roughness of HSG polysilicon can be obtained. Therefore if the maximum roughness, or highest capacitance is desired, a very narrow temperature range, has to be controlled throughout the length of the deposition tool, to achieve the uniformity of roughness from wafer to wafer.

Figure 4:
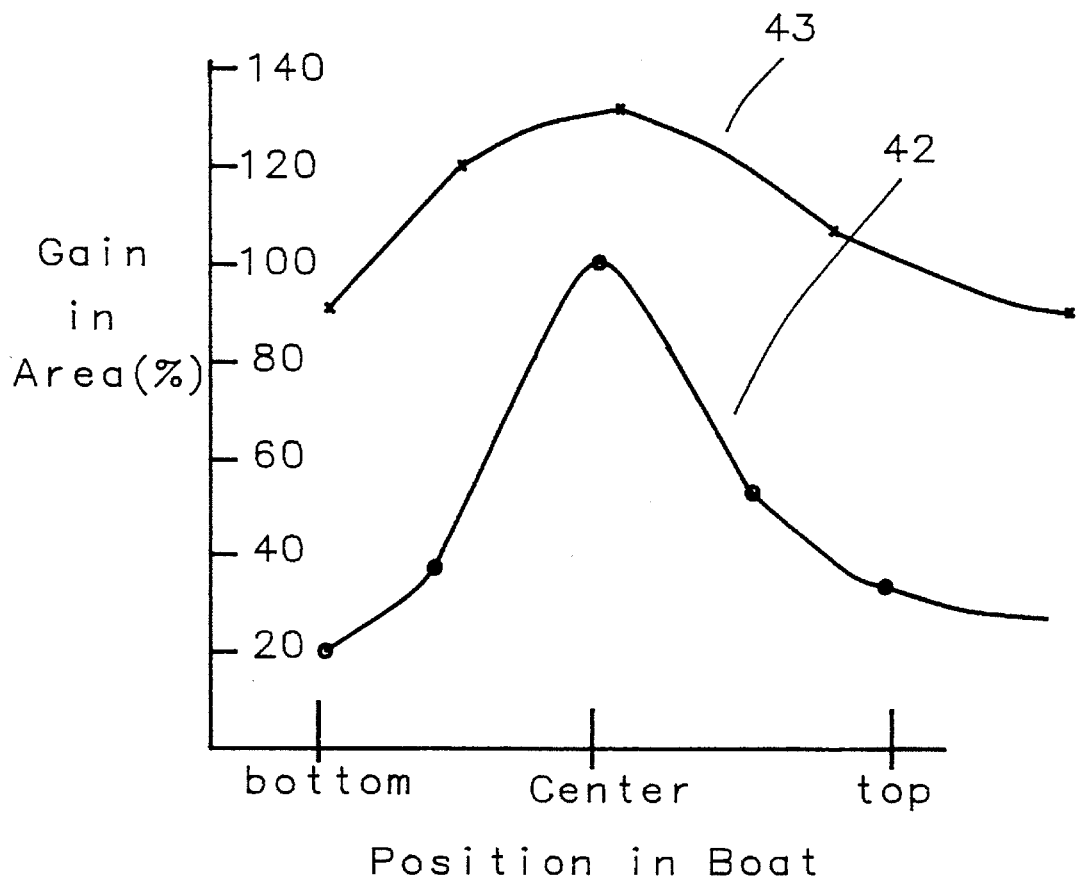
FIG. 4, graphically shows the uniformity of the roughness of the HSG polysilicon layers, from wafer to wafer, deposited using a conventional single reactant injection inlet, as well as the uniformity of roughness of HSG polysilicon layers, deposited using multiple reactant injection inlets.

An LPCVD tool, designed to provide the needed temperature control, to uniformly maintain the narrow temperature range for maximum HSG roughness, from wafer to wafer, across the entire length of the deposition tool, and used in this invention, is shown schematically in FIG. 3. The LPCVD tool consists of an outer quartz tube, 21, as well as an inner quartz tube, 22. A wafer boat, 32, about 1000 millimeters, (mm), in length, is used to hold wafers, 33. To provide the critical narrow temperature range needed to secure the maximum HSG polysilicon roughness across the entire length of the wafer boat, so that wafers in all positions on wafer boat, 32, will experience the narrow temperature range, five heating zones, 27–31, have been implemented. In addition, to avoid reactant concentration depletion, as a result of the reactants passing through the inner tube, a three zone, reactant injection design, featuring three L shaped injectors, 24–26, have also been implemented. The reactant gases enter the main injection inlet, 23, and subdivide to enter the 1000 mm length, injector, 22, at a first location, between about 200 to 300 mm, at a second location, between 350–450 mm, and at a third location, between about 500–700 mm. This novel injection design results in improved HSG roughness, from wafer to wafer. FIG. 4, graphically shows the HSG roughness uniformity, in terms of percentage gain in surface area of an HSG polysilicon surface, as a function of wafer position in the wafer boat, 32. It can be seen that using an LPCVD tool with five zone heating, but with only a single reactant injection inlet, poor uniformity, 42, for wafers situated across the length of the boat, results. However the use of the multiple reactant injection inlets, results in improved uniformity, 43, for counterparts, again located across the length of wafer boat, 32. The implementation of the multiple heating and reactant injection inlets, although shown for a vertical LPCVD tool, can also be applied to horizontal LPCVD tools.

Figure 5:
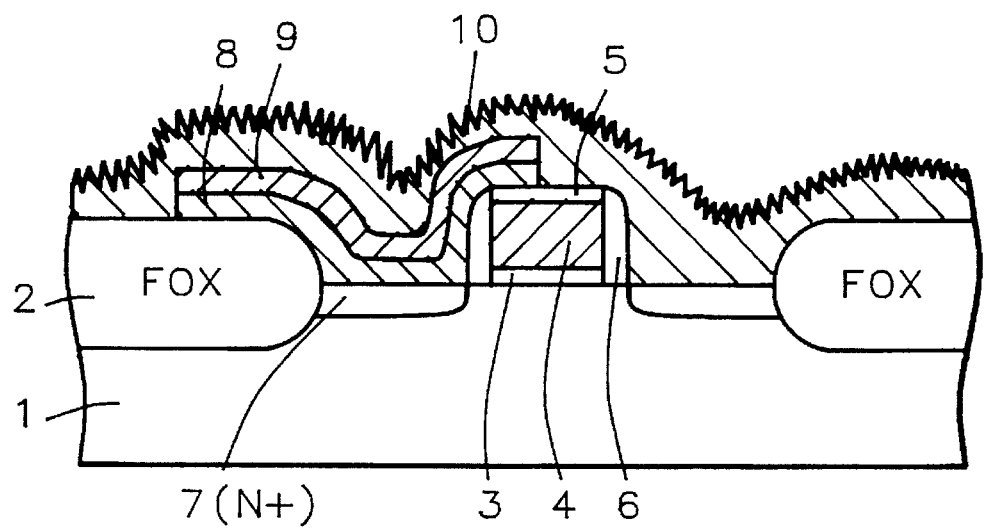
FIGS. 5–6, schematically showing the stages of fabrication used to complete the stacked capacitor structure.

Returning again to the fabrication of the stacked capacitor structure, polysilicon layer, 10, is deposited in the LPCVD reactor, described in FIG. 4, at a temperature between about 535° to 600° C., to a thickness between about 400 to 1500 Angstroms, using $Si_2H_6$. This is schematically shown in FIG. 5. The increase in surface roughness of HSG polysilicon layer, 10, in terms of capacitance, is between about 1.8 to 2.4 times greater than counterparts fabricated with flat polysilicon surfaces. Photolithographic and RIE procedures, again using $Cl_2$ and HBr as etchants, are used to define the desired pattern in HSG polysilicon layer, 10. Photoresist removal is accomplished via plasma oxygen ashing and careful wet cleans.

Figure 6:
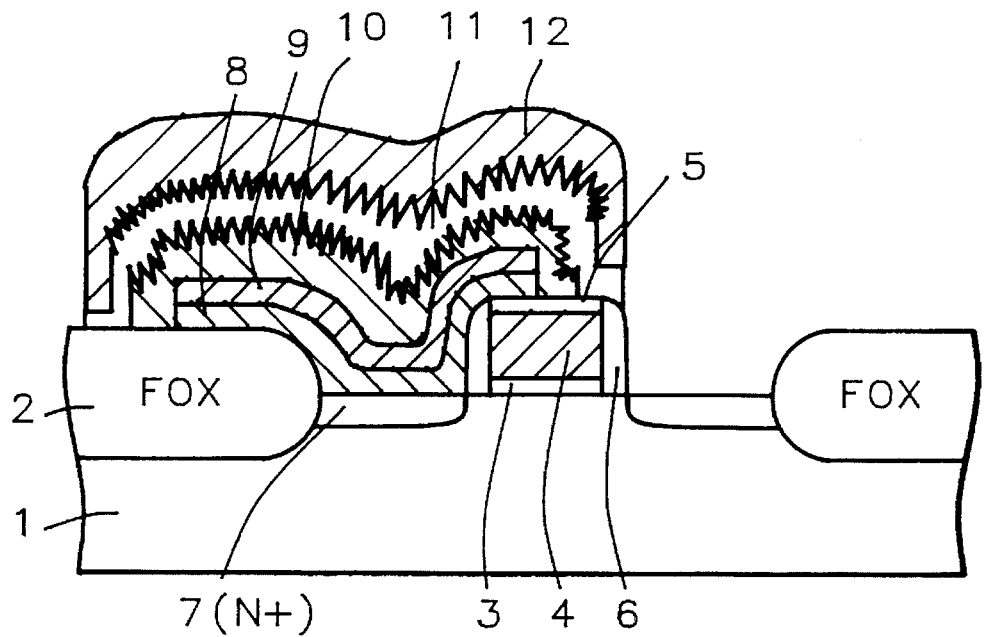

Next the creation of the capacitor dielectric is addressed. A composite layer of oxynitride - nitride - oxide, (ONO), 11, is used at an equivalent silicon dioxide thickness of between about 40 to 80 Angstroms. This is shown schematically in FIG. 6. The ONO layer is created by initially forming an native silicon oxide layer, on HSG, polysilicon layer, 10, as a result of cleaning the surface of HSG polysilicon layer, 10, using a sulfuric acid—hydrogen peroxide mixrue, (SPM), at a temperature between about 100° to 130° C., to a thickness between about 8 to 15 Angstroms. Next a thin layer of silicon nitride is deposited using LPCVD procedures, at a temperature between about 650° to 750° C., to a thickness between about 50 to 80 Angstroms. Finally the structure is subjected to an oxygen—steam ambient, at a temperature between about 850° to 950° C., for between about 20 to 40 minutes, for purposes of converting the surface of the silicon nitride layer to a silicon oxynitride surface. Another layer of polysilicon, 12, is deposited using LPCVD procedures, at a temperature between about 550° to 600° C., to a thickness between about 500 to 2000 Angstroms, via use of insitu doping, using $SiH_4$ and $PH_3$. Polysilicon layer, 12, can also be deposited intrinsically and doped via ion implantation of phosphorous. Conventional photolithographic and RIE procedures, again using $Cl_2$ and HBr as etchants, are used to define the upper electrode, or cell plate, of the stacked capacitor structure, shown schematically in FIG. 6. The RIE procedure, at the completion of the polysilicon etching, results in the removal of the capacitor dielectric layer, in regions not covered by cell plate polysilicon. Photoresist removal is once again performed using plasma oxygen ashing and careful wet cleans.

This process, for obtaining HSG polysilicon layers, with optimum roughness, and excellent uniformity, via use of a LPCVD tool, featuring multiple heating zones, as well as multiple reactant injection inlets, although described using a vertical LPCVD tool, can also be accomplished using a horizontal LPCVD tool. In addition, although this invention was applied to N channel transfer gate transistors, it could also be applied to P channel transfer gate transistors.

While this invention has been particularly shown and described with reference to the preferred embodiments thereof, it will be understood by those skilled in the art that various changes in form and details may be made without departing from the spirit and scope of this invention.

What is claimed is:

1. A method for fabricating a stacked capacitor, dynamic random access memory, (DRAM), device, on a semiconductor substrate, using a hemispherical grained polysilicon layer as part of a storage node structure, with said hemispherical grain polysilicon layer being deposited in a LPCVD tool, featuring multiple heating zones and multiple reactant injection inlets, comprising the steps of:

providing a transfer gate transistor in said substrate, comprised of a gate insulator, a polysilicon gate structure, completely protected with insulator, and source and drain regions;

depositing a first polysilicon layer on an underlying, said transfer gate transistor;

depositing a second polysilicon layer on said first polysilicon layer;

patterning of said second polysilicon layer, and of said first polysilicon layer, to form bottom portion of said storage node structure, contacting source and drain region of said transfer gate transistor;

depositing said hemispherical grained polysilicon layer, on said bottom portion of said storage node, and on said transfer gate transistor, using an LPCVD tool for deposition of said hemispherical grained polysilicon layer, in which said LPCVD tool is equipped with multiple heating zones, and multiple reactant injection inlets;

patterning of said hemispherical grained polysilicon layer, to complete formation of said storage node structure;

formation of a composite dielectric layer on said storage node structure;

depositing a fourth polysilicon layer on said storage node structure, and on said transfer gate transistor, not covered by said storage node structure; and patterning of said fourth polysilicon layer, and of said capacitor dielectric, to form cell plate for said stacked capacitor structure.

2. The method of claim 1, wherein said transfer gate transistor is an N type, field effect transistor, with a silicon dioxide layer, used for said gate insulator, at a thickness between about 80 to 170 Angstroms.

3. The method of claim 1, wherein said first polysilicon layer is deposited intrinsically, using LPCVD procedures, at a temperature between about 550° to 630° C., to a thickness between about 1000 to 3000 Angstroms, using $SiH_4$ as a reactant gas.

4. The method of claim 1, wherein said second polysilicon layer is deposited, using LPCVD procedures, including insitu doping with $SiH_4$ and $PH_3$ as reactant gasses, at a temperature between about 550° to 600° C., to a thickness between about 500 to 2500 Angstroms.

5. The method of claim 1, wherein said second polysilicon layer is deposited intrinsically, using LPCVD procedures, with $SiH_4$ as a reactant gas, at a temperature between about 550° to 630° C., to a thickness between about 550 to 2500 Angstroms, and then doped via phosphorous ion implantation, at an energy between about 30 to 60 KeV, at a dose between about 5E14 to 5E15 atoms/$cm^2$.

6. The method of claim 1, wherein said hemispherical grained polysilicon layer is deposited in said LPCVD tool, comprised of between about 3 to 6 heating zones, and comprised of between about 2 to 4 reactant injection inlets.

7. The method of claim 1, wherein said hemispherical grained polysilicon layer is deposited at a temperature between about 535° to 600° C., to a thickness between about 400 to 1500 Angstroms, using $Si_2H_6$ as a reactant gas.

8. The method of claim 1, wherein patterning of said hemispherical grained polysilicon layer is performed via reactive ion etching, using $Cl_2$ and HBr as etchants.

9. The method of claim 1, wherein said composite dielectric layer is comprised of silicon oxynitride—silicon nitride—silicon dioxide obtained by: growing an native silicon oxide layer on the surface, of said hemispherical grained polysilicon, using a sulfuric acid—hydrogen peroxide mixture, at a temperature between about 100° to 130° C., to a thickness between about 8 to Angstroms; deposition of a silicon nitride layer, using LPCVD procedures, at a temperature between about 650° to 750° C., to a thickness between about 50 to 80 Angstroms; and an oxidation of said silicon nitride layer, at a temperature between about 850° to 950° C., in an oxygen—steam ambient, to form between about 10 to 30 Angstroms of silicon oxynitride on the underlying, said silicon nitride layer.

10. The method of claim 1, wherein said fourth polysilicon layer is deposited intrinsically, using LPCVD procedures, using $SiH_4$ as a reactant gas, at a temperature between about 550° to 630° C., to a thickness between about 1000 to 2500 Angstroms, and then doped via ion implantation of phosphorous.

11. The method of claim 1, wherein said fourth polysilicon layer is deposited using LPCVD procedures, including insitu doping via use of $SiH_4$ and $PH_3$ as reactant gasses, at a temperature between about 550° to 600° C., to a thickness between about 1000 to 2500 Angstroms.

12. The method of claim 1, wherein said fourth polysilicon is patterned, via reactive ion etching, using $Cl_2$ and HBr as etchants, to form said cell plate, of said stacked capacitor structure, completely covering underlying, said composite dielectric layer, and said storage node structure, with said storage node composed of said hemispherical grained polysilicon layer, said second polysilicon layer, and said first polysilicon layer.

* * * * *